United States Patent
Tan et al.

(10) Patent No.: US 11,956,917 B2
(45) Date of Patent: Apr. 9, 2024

(54) TRAY FOR EXPANSION DEVICE AND SERVER HAVING SAME

(71) Applicant: Wistron Corporation, New Taipei (TW)

(72) Inventors: Si-Yun Tan, New Taipei (TW); Yi-Sheng Chen, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 41 days.

(21) Appl. No.: 17/546,163

(22) Filed: Dec. 9, 2021

(65) Prior Publication Data
US 2023/0049413 A1 Feb. 16, 2023

(30) Foreign Application Priority Data
Aug. 16, 2021 (CN) .......................... 202110938013.3

(51) Int. Cl.
*H05K 7/14* (2006.01)

(52) U.S. Cl.
CPC .................................. *H05K 7/1489* (2013.01)

(58) Field of Classification Search
CPC ...... H05K 7/18; H05K 7/1488; H05K 7/1497; H05K 7/1489; B21D 5/00; G11B 33/12; G11B 33/123; F16M 13/022; F16M 13/02; F16M 13/025; E05C 3/16
See application file for complete search history.

(56) References Cited

U.S. PATENT DOCUMENTS

| | | | | |
|---|---|---|---|---|
| 9,122,458 B2* | 9/2015 | Yu | ........................... | G06F 1/185 |
| 9,826,658 B1* | 11/2017 | Mao | ........................ | G06F 1/183 |
| 10,168,747 B2* | 1/2019 | Zhu | ........................ | H05K 7/1489 |
| 10,251,300 B1* | 4/2019 | Mao | ........................ | H05K 7/1487 |
| 10,863,644 B1* | 12/2020 | Tseng | ........................ | H05K 7/1487 |
| 11,310,932 B2* | 4/2022 | Chang | ........................ | H05K 7/16 |
| 2009/0273901 A1* | 11/2009 | Jaramillo | ............. | H05K 7/1492 361/679.58 |
| 2015/0103492 A1* | 4/2015 | Wu | ........................ | H05K 7/1461 361/726 |
| 2018/0329463 A1* | 11/2018 | Liu | ........................ | G06F 1/182 |

FOREIGN PATENT DOCUMENTS

CN 115391267 A * 11/2022 ............. H05K 5/023

* cited by examiner

*Primary Examiner* — Ko H Chan
(74) *Attorney, Agent, or Firm* — McClure, Qualey & Rodack, LLP

(57) ABSTRACT

A tray module is applicable to a chassis. The chassis includes at least two side plates. Each side plate has a guiding portion. The guiding portion includes a first horizontal section and an ascending section, and the ascending section is connected to the first horizontal section. The tray module includes a carrier body, at least two first connecting rods, and at least two second connecting rods. Each first connecting rod has a movable end and a driven end. The movable end is pivotally connected to the carrier body and slidably disposed in the guiding portions. Each second connecting rod has a pivotal end, a pivotal connection portion, and an operating end. The pivotal connection portion is located between the pivotal end and the operating end. Each pivotal end is pivotally connected to the each side plate. Each driven end is pivotally connected to each pivotal connection portion.

17 Claims, 8 Drawing Sheets

TRAY FOR EXPANSION DEVICE AND SERVER HAVING SAME

CROSS-REFERENCE TO RELATED APPLICATION

This non-provisional application claims priority under 35 U.S.C. § 119(a) to Patent Application No. 202110938013.3 filed in China, P.R.C. on Aug. 16, 2021, the entire contents of which are hereby incorporated by reference.

BACKGROUND

Technical Field

The present invention relates to a tray applicable to a rack, and in particular, to a tray module and a server having the tray module.

Related Art

Generally, a chassis of a server has protrusions of other hard disk devices and structures. Therefore, front, rear, left, and right structures in the chassis needs to be avoided during assembly of an old hard disk rack, which has a cumbersome assembly process. In addition, the hard disk rack has a considerable weight due to loading of a hard disk device, and therefore also requires lots of efforts during the assembling.

SUMMARY

In view of this, according to an embodiment, a tray module is provided and applicable to a chassis, and the chassis includes at least two side plates. Each side plate has a guiding portion, each guiding portion includes a first horizontal section and an ascending section, and the ascending section is connected to the first horizontal section. The tray module includes a carrier body, two first connecting rods, and two second connecting rods. Each first connecting rod has a movable end and a driven end, and the movable end of the two first connecting rods is pivotally connected to the carrier body and slidably disposed in the each guiding portion. Each second connecting rod has a pivotal end, a pivotal connection portion, and an operating end, the pivotal connection portion is located between the pivotal end and the operating end, each pivotal end is pivotally connected to the each side plate, and each driven end is pivotally connected to each pivotal connection portion.

In some embodiments, the tray module further includes an elastic element disposed on the chassis, a hook portion is disposed on one of the two second connecting rods and located between the pivotal end and the operating end, and the elastic element is connected to the hook portion.

In some embodiments, the tray module further includes a positioning assembly, where the positioning assembly includes a toggle member and a torsion spring, the toggle member is disposed on the chassis and close to the pivotal end of one of the two second connecting rods, one end of the torsion spring abuts against the chassis, another end of the torsion spring abuts against the toggle member, the toggle member includes a toggle member body and a protrusion, the protrusion protrudes toward the pivotal end, a sliding portion is disposed on the pivotal end and includes a recess, two stop portions, a first end, and a second end, the first end is opposite to the second end, the recess is close to the first end, the two stop portions are respectively disposed on the first end and the second end, and the protrusion of the toggle member is selectively accommodated in the recess or located on the second end.

In some embodiments, the each guiding portion includes a first horizontal section and an inclined section, the inclined section is connected to the first horizontal section.

In some embodiments, the each guiding portion further includes a second horizontal section connected to the inclined section, and the first horizontal section, the inclined section, and the second horizontal section of the each guiding portion form a shape a bit like S.

In some embodiments, a first section extends from the pivotal end to the pivotal connection portion of the each second connecting rod, a second section extends from the pivotal connection portion to the operating end, the second section is inclined to the first section, when the movable end is located on the first horizontal section, a first included angle is formed between the first section and the first connecting rod, when the movable end is located on the inclined section, a second included angle is formed between the first section and the first connecting rod, and the first included angle is less than the second included angle.

In some embodiments, the tray module further includes a handle, where the handle is disposed on the operating ends of the two second connecting rods and connected to the two second connecting rods.

In some embodiments, the each first connecting rod has a bump, and each bump is disposed on the each movable end and is movably accommodated in the each guiding portion.

In some embodiments, the at least two side plates include four side plates, the movable ends of the two first connecting rods are pivotally connected to the two sides of the carrier body respectively and are movably accommodated in the guiding portions of two of the four side plates, two protruding points are disposed on the two sides of the carrier body, and the carrier body is movably accommodated in the guiding portions of other two of the four side plates by means of the two protruding points.

According to an embodiment, a server is provided, including a rack, a tray module, and a function module. The tray module is correspondingly disposed on the rack. The rack includes at least two side plates. Each side plate has a guiding portion, each guiding portion includes a first horizontal section and an inclined section, and the inclined section is connected to the first horizontal section. The tray module includes a carrier body, two first connecting rods, and two second connecting rods. Each first connecting rod has a movable end and a driven end, and the movable end of the two first connecting rods is pivotally connected to the carrier body and slidably disposed in the each guiding portion. Each second connecting rod has a pivotal end, a pivotal connection portion, and an operating end, the pivotal connection portion is located between the pivotal end and the operating end, each pivotal end is pivotally connected to the each side plate, and each driven end is pivotally connected to each pivotal connection portion. The function module is located on the carrier body.

Based on the above, according to some embodiments, a tray module is applicable to a chassis. The chassis includes at least two side plates. The at least two side plates have guiding portions. The tray module includes a carrier body, two first connecting rods, and two second connecting rods. A movable end of each first connecting rod is pivotally connected to the carrier body and slidably disposed in each guiding portion. A pivotal end of each second connecting rod is pivotally connected to the each side plate, and a pivotal connection portion of the second connecting rod is pivotally connected to a driven end of the first connecting rod, so that the carrier body is movable between a first horizontal section and an inclined section by operating the operating end of the second connecting rod, thereby saving labor and achieving easy assembling of the tray module to the chassis. A user may pull up a platform backward and upward by means of the second connecting rods being interlinked to the first connecting rods, so as to avoid a barrier. In addition, through the design of the inclined section of the guiding portion, an effect of saving labor can be achieved.

DETAILED DESCRIPTION

Figure 1:
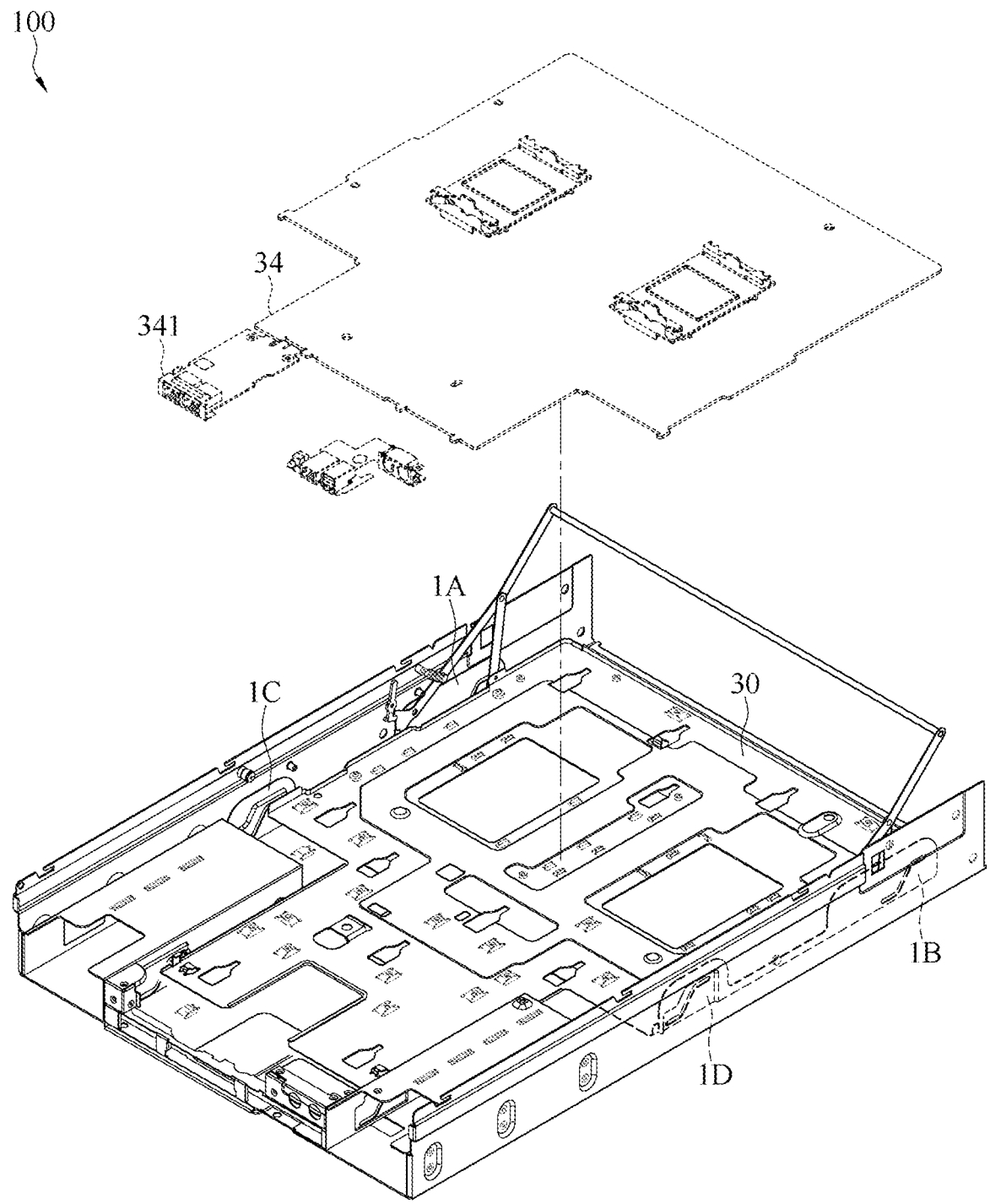
FIG. 1 illustrates a schematic three-dimensional view of a tray module according to an embodiment.
Figure 2:
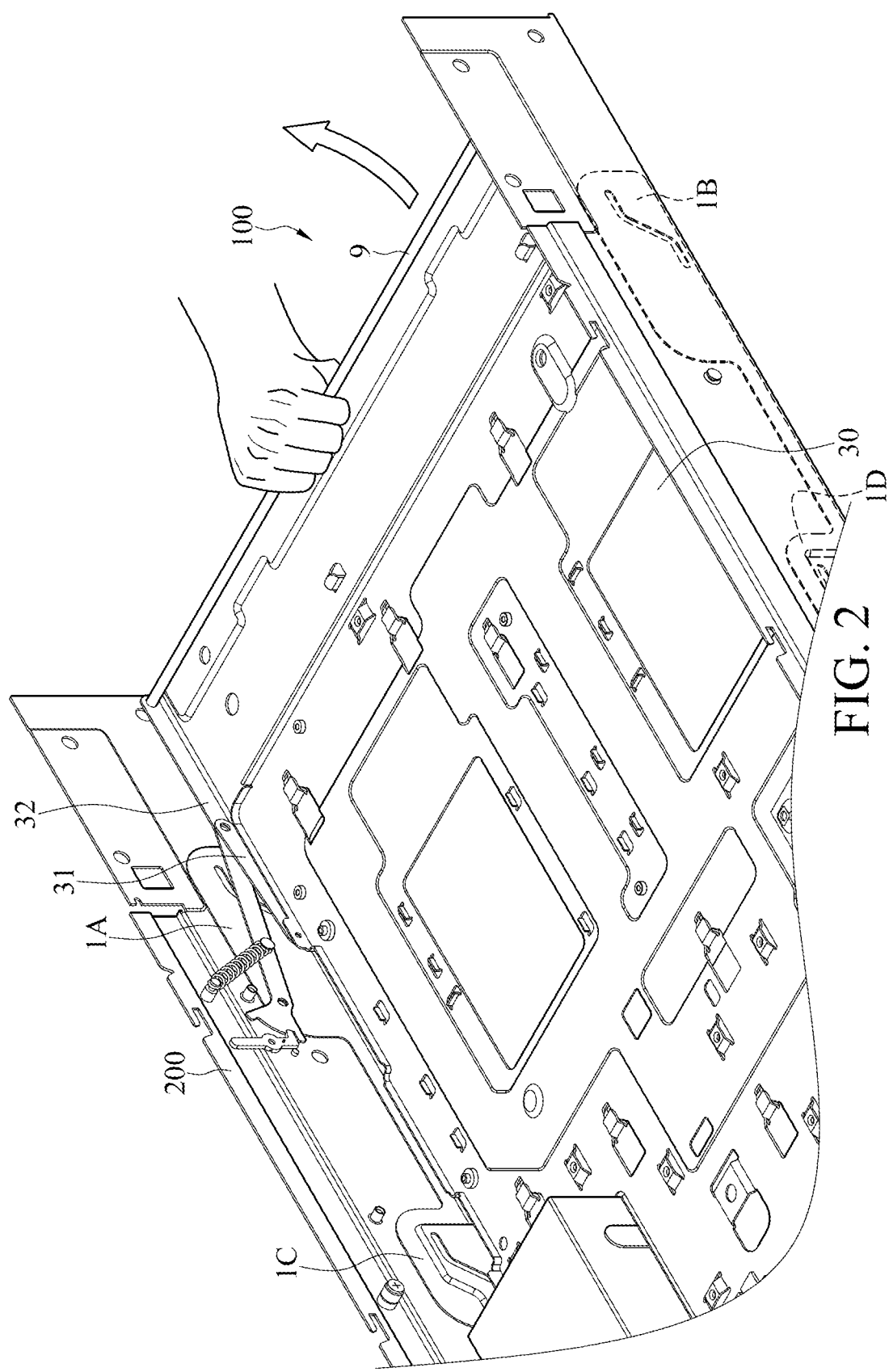
FIG. 2 illustrates a schematic diagram of the tray module in a received state according to an embodiment.
Figure 3:
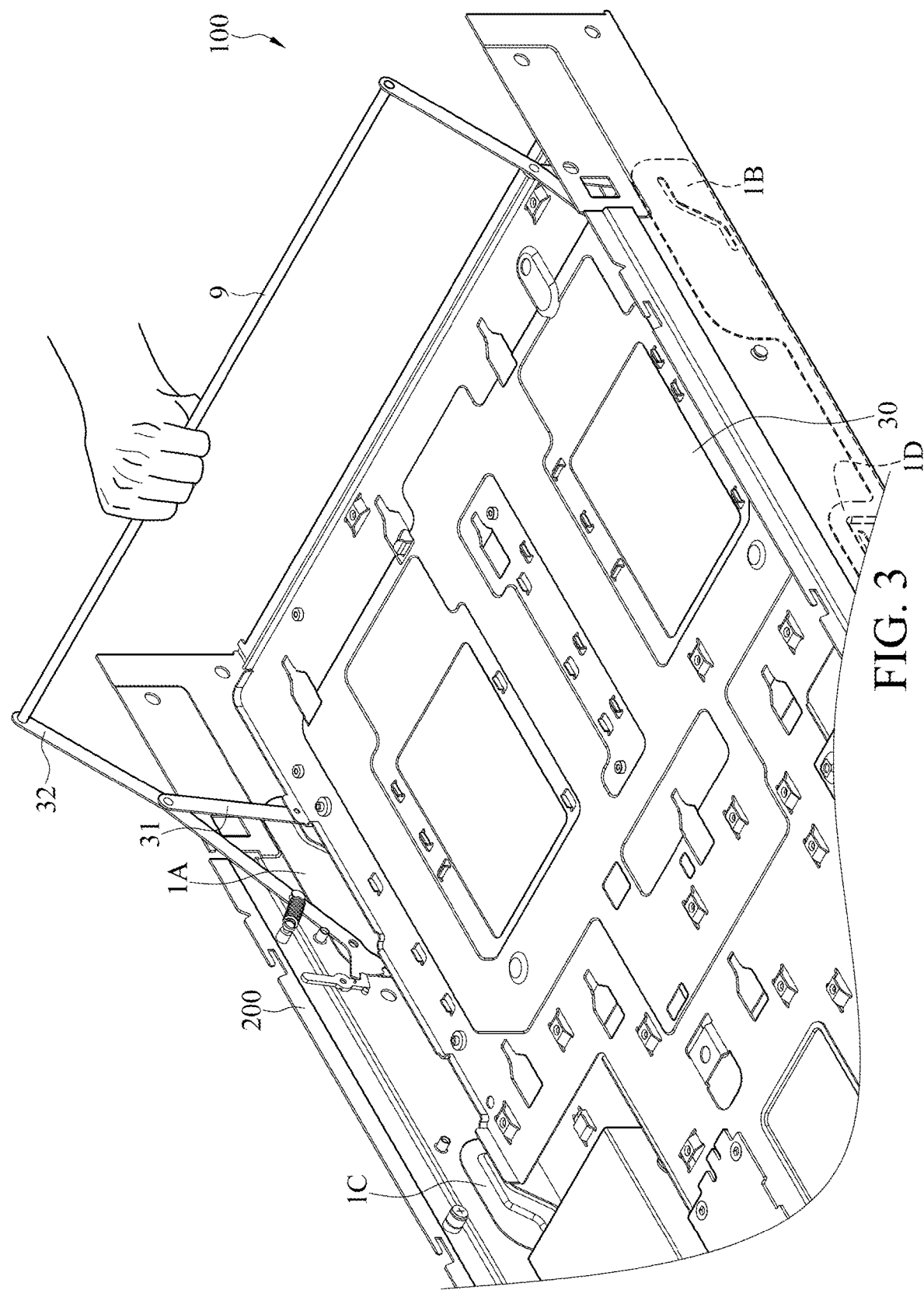
FIG. 3 illustrates a schematic diagram of the tray module in a lifted state according to an embodiment.
Figure 4:
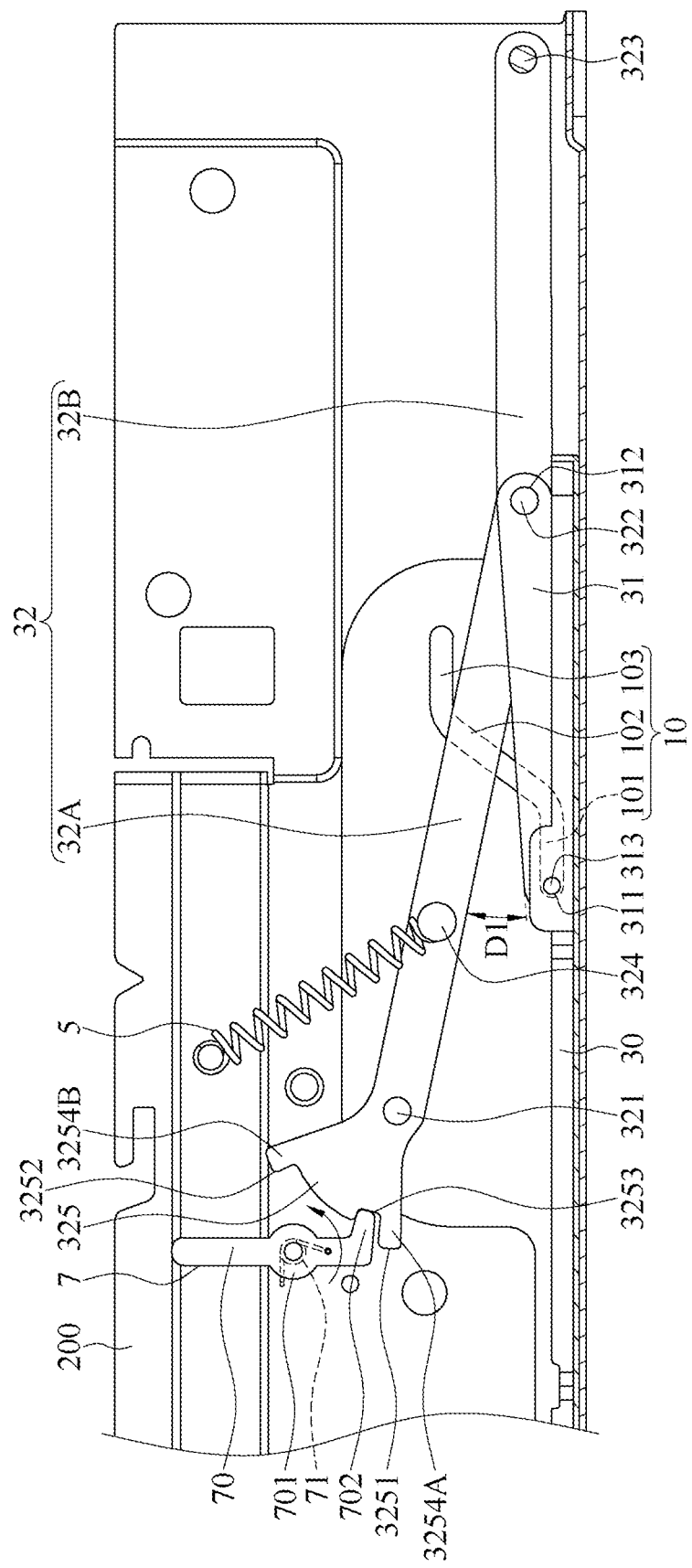
FIG. 4 illustrates a partial schematic diagram of the tray module in the received state according to an embodiment.
Figure 5:
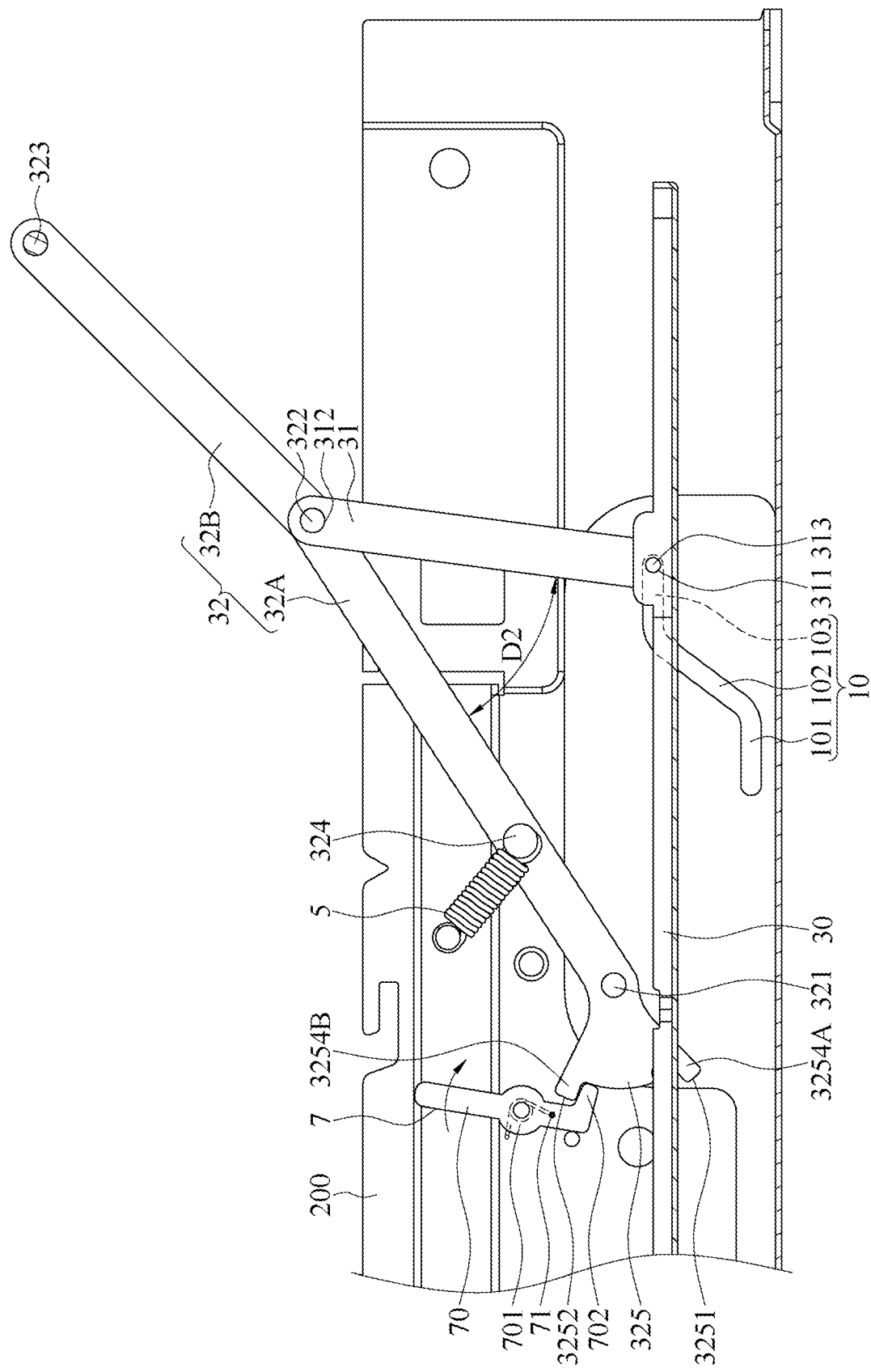
FIG. 5 illustrates a partial schematic diagram of the tray module in the lifted state according to an embodiment.

Refer to FIG. 1 to FIG. 5. FIG. 1 illustrates a schematic three-dimensional view of a tray module according to an embodiment. FIG. 2 illustrates a schematic diagram of the tray module in a received state according to an embodiment. FIG. 3 illustrates a schematic diagram of the tray module in a lifted state according to an embodiment. FIG. 4 illustrates a partial schematic diagram of the tray module in the received state according to an embodiment. FIG. 5 illustrates a partial schematic diagram of the tray module in the lifted state according to an embodiment. The present disclosure discloses a tray module 100 in an embodiment. The tray module 100 is applicable to a chassis 200. The chassis 200 includes at least two side plates 1A and 1B. The tray module 100 may be assembled to the chassis 200 and is configured to carry an expansion element such as a hard disk device, a circuit board, and the like. In some embodiments, the chassis 200 is a part of a rack server rack, and the rack is configured to accommodate one or more rack servers and an expansion element. A height of a rack server is in U (1U=1.75 inches=44.45 millimeters). The rack is, for example, but not limited to, a rack configured to accommodate the rack servers having specifications of 1U to 7U and the like.

As shown in FIG. 4 and FIG. 5, each of the side plates 1A and 1B has a guiding portion 10. In some embodiments, the guiding portion 10 may be, for example, a groove or a track member. The guiding portion is the groove by way of example, but the present disclosure is not limited thereto. In some embodiments, the guiding portion 10 includes a first horizontal section 101, an inclined section 102, and a second horizontal section 103, the inclined section 102 is connected to the first horizontal section 101, and the second horizontal section 103 is connected to the inclined section 102. A quantity of the side plates 1A and 1B is configured to be an even number, for example, two, four, or six. The first horizontal section 101, the inclined section 102, and the second horizontal section 103 of the each guiding portion form a shape a bit like S. The shape of the guiding portion 10 has a plurality of implementations, and detailed shape structures are described in detail later. The following description is made by using an S-shaped guiding portion as an example, but the present disclosure is not limited thereto. In some embodiments, each of the side plates 1A and 1B has a same corresponding structure. The side plate 1A on one side is used as an example for description in FIG. 4 and FIG. 5. The inclined section 102 is inclined relative to the first horizontal section 101 and the second horizontal section 103.

As shown in FIG. 2 and FIG. 5, the tray module 100 includes a carrier body 30, two first connecting rods 31, and two second connecting rods 32. Each first connecting rod 31 has a movable end 311 and a driven end 312. The movable end 311 of the two first connecting rods 31 is pivotally connected to the carrier body 30 and slidably disposed in the guiding portion 10. Each second connecting rod 32 has a pivotal end 321, a pivotal connection portion 322, and an operating end 323. Each pivotal connection portion 322 is located between the pivotal end 321 and the operating end 323, and each pivotal end 321 is pivotally connected to each of the side plates 1A and 1B. Each driven end 312 is pivotally connected to the each pivotal connection portion 322. In some embodiments, each first connecting rod 31 and each second connecting rod 32 have a same corresponding structure. The first connecting rod 31 and the second connecting rod 32 on only one side are used as an example for description in FIG. 4 and FIG. 5. The movable end 311 and the driven end 312 of the first connecting rod 31 are opposite to each other, that is, the driven end 312 is located on another end far away from the movable end 311. The pivotal end 321 and the operating end 323 are located on two opposite ends of the second connecting rod 32. As shown in FIG. 2 and FIG. 4, when the tray module 100 is in a received state, the movable end 311 of the first connecting rod 31 is located on a far left side of the first horizontal section 101 (in a direction from the view of FIG. 4). As shown in FIG. 3 and FIG. 5, during the operation, a user holds and pulls up a handle 9 to a right side and an upper side from the view of FIG. 4, so that the tray module 100 is lifted up, and at this point, the movable end 311 is located on the second horizontal section 103. A smaller slope of inclination of the inclined section 102 relative to the first horizontal section 101 indicates a more labor-saving stroke of the carrier body 30 on the inclined section 102. For example, a joint of the first horizontal section 101, the inclined section 102, and the second horizontal section 103 is a rounded corner or an obtuse angle, so that the movable end 311 can be more smoothly slid between the first horizontal section 101 and the second horizontal section 103.

Specifically, the tray module 100 is applicable to the chassis 200. The chassis 200 includes at least two side plates 1A and 1B. The at least two side plates 1A and 1B each have a guiding portion 10. The tray module 100 includes a carrier body 30, two first connecting rods 31, and two second connecting rods 32. A movable end 311 of each first connecting rod 31 is pivotally connected to the carrier body 30 and slidably disposed in the guiding portion 10. A pivotal end 321 of each second connecting rod 32 is pivotally connected to each of the side plates 1A and 1B, and a pivotal connection portion 322 of the each second connecting rod 32 is pivotally connected to a driven end 312 of the first connecting rod 31, so that the carrier body 30 is movable between a first horizontal section 101 and an inclined section 103 by operating the operating end 323 of the second connecting rod 32, thereby saving labor and achieving easy assembling of the tray module 100 to the chassis 200.

The each first connecting rod 31 has a bump 313, and each bump 313 is disposed on the each movable end 311 and is movably accommodated in the each guiding portion 10.

As shown in FIG. 4 and FIG. 5, the tray module 100 further includes an elastic element 5. The elastic element 5 is disposed on the chassis 200, a hook portion 324 is disposed on one of the two second connecting rods 32 and located between the pivotal end 321 and the operating end 323, and the elastic element 5 is adjacent to the hook portion 324 and connected to the hook portion 324. The elastic element 5 is only disposed on one of two sides of the chassis 200, but the present disclosure is not limited thereto. The side plate 1A is used as an example in FIG. 4 and FIG. 5. The elastic element 5 is disposed on a side edge of the chassis 200 and adjacent to the side plate 1A. The hook portion 324 mated with the elastic element 5 is disposed on the second connecting rod 32 at the side plate 1A, and is located between the pivotal end 321 and the pivotal connection portion 322. The elastic element 5 is snapped to the hook portion 324. An elastic force of the elastic element 5 provides an upward lifting force to lift up the second connecting rod 32 and causes the movable end 311 of the first connecting rod 31 to move from the first horizontal section 101 to the second horizontal section 103, so that the tray module 100 is changed from a received state to a lifted state. In some embodiments, the elastic element 5 is an extension spring. Specifically, as shown in FIG. 4, when the tray module 100 is in the received state, the movable end 311 is on the first horizontal section 101, and the elastic element 5 is in a stretched state. When the tray module 100 is to be lifted up, the user moves the movable end 311 to the second horizontal section 103 by using the handle 9. As shown in FIG. 5, when the movable end 311 is on the second horizontal section 103, the elastic element 5 is retracted and lifts up the second connecting rod 32, thereby saving labor and achieving automatic recovery by means of the elastic element 5.

Referring to FIG. 4 and FIG. 5, in some embodiments, the tray module 100 includes a positioning assembly 7. The positioning assembly 7 includes a toggle member 70 and a torsion spring 71, and the toggle member 70 is disposed on the chassis 200. The toggle member 70 is adjacent to the pivotal end 321 of one of the two second connecting rods 32. One end of the torsion spring 71 abuts against the chassis 200, and another end of the torsion spring abuts against the toggle member 70. The toggle member 70 includes a toggle member body 701 and a protrusion 702. The protrusion 702 protrudes toward the pivotal end 321, and a sliding portion 325 is disposed on the pivotal end 321 and includes a first end 3251, a second end 3252, a recess 3253, and two stop portions 3254A and 3254B. The first end 3251 is opposite to the second end 3252, the recess 3253 is adjacent to the first end 3251, and the two stop portions 3254A and 3254B are respectively disposed on the first end 3251 and the second end 3252. The protrusion 702 of the toggle member 70 is selectively accommodated in the recess 3253 or located on the second end 3252. In this embodiment, the toggle member 70 is disposed only on one of two sides of the chassis 200, but the present disclosure is not limited thereto. A tray may also include two positioning assemblies 7. The toggle member 70 is disposed on a side edge of the chassis 200 and adjacent to the pivotal end 321 of the second connecting rod 32, and a sliding portion 325 mated with the toggle member 70 is disposed on the second connecting rod 32 at the side plate 1A and disposed on the pivotal end 321. Specifically, as shown in FIG. 4, when the tray module 100 is in the received state, the protrusion 702 of the toggle member 70 is accommodated in the recess 3253 of the sliding portion 325 and abuts against the stop portion 3254A of the first end 3251, so that the second connecting rods 32 are fixed to stably maintain the tray module 100 in the received state. As shown in FIG. 5, when the tray module 100 is to be lifted up, the user toggles the toggle member 70 so that the protrusion 702 is separated from the recess 3253, so as to release the second connecting rod 32. Then the user may lift up the second connecting rod 32 to move the movable end 311 of the first connecting rod 31 from the first horizontal section 101 to the second horizontal section 103. When the movable end 311 is on the second horizontal section 103, that is, when the second connecting rod 32 is lifted up, the protrusion 702 of the toggle member 70 abuts against the stop portion 3254B of the second end 3252 of the sliding portion 325. By means of the toggle member 70, the tray module 100 can be in the received state or in the lifted state. Specifically, as shown in FIG. 4, the torsion spring 71 continuously provides an elastic force in a counter-clockwise direction (from the view of FIG. 4) to accommodate the protrusion 702 in the recess 3253, so as to position the movable end 311 on the first horizontal section 101. When the user applies the force in a clockwise direction to overcome the elastic force of the torsion spring 71, as shown in FIG. 5, the toggle member 70 is separated from the recess 3253, and the pivotal end 321 of the second connecting rod 32 is pivotable due to being released. When the movable end 311 is located on the second horizontal section 103, the protrusion 702 is located on the second end 3252, so that the movable end 311 is positioned on the second horizontal section 103.

Figure 6:
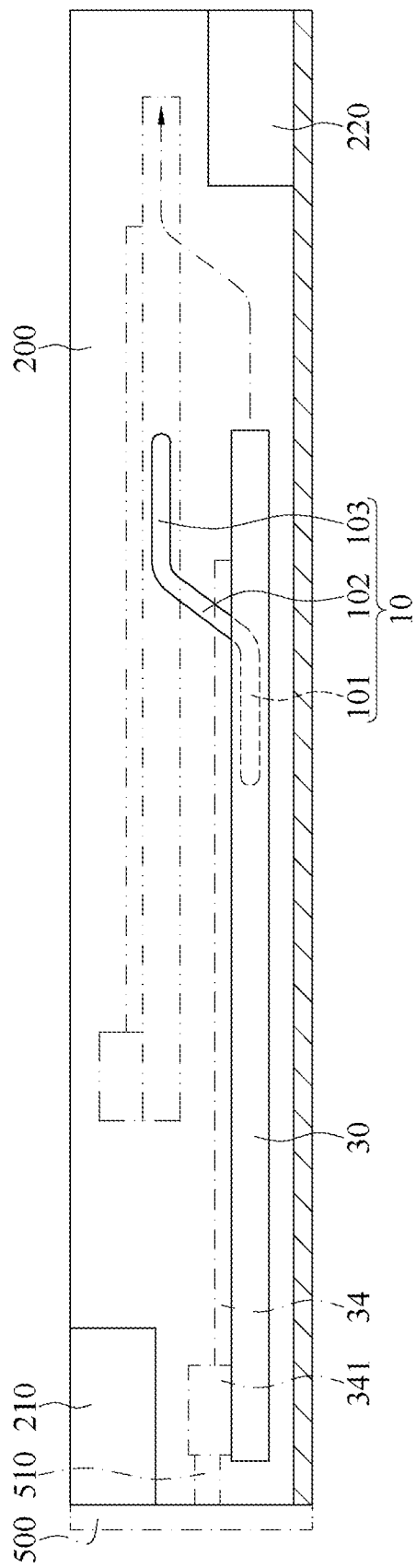
FIG. 6 illustrates a schematic movement diagram (I) of the tray module according to an embodiment.
Figure 7:
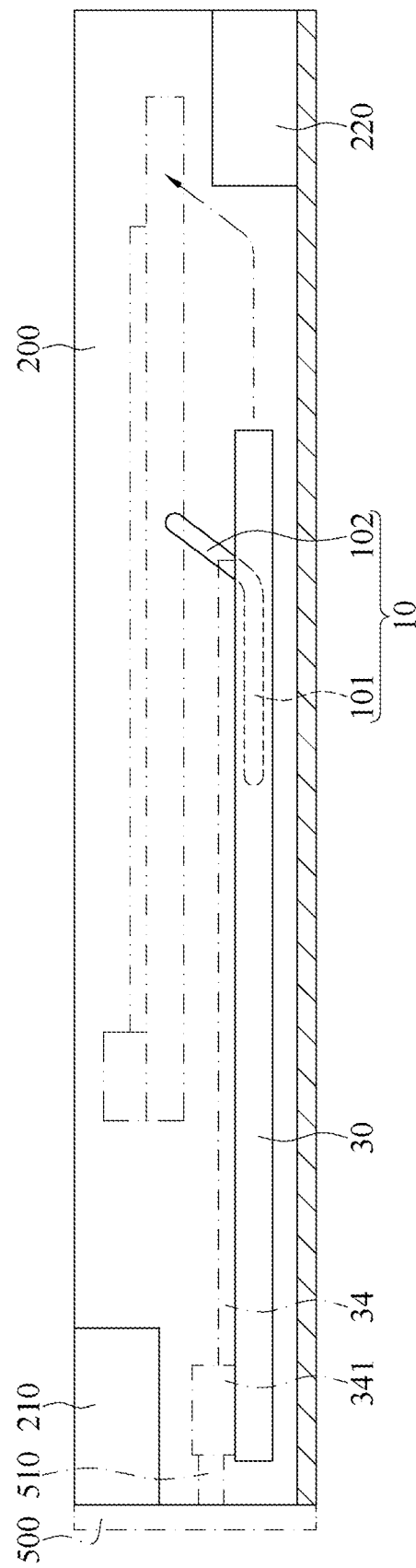
FIG. 7 illustrates a schematic movement diagram (II) of the tray module according to an embodiment.

The shape of the guiding portion 10 has a plurality of implementations. Refer to FIG. 6 and FIG. 7. FIG. 6 illustrates a schematic movement diagram (I) of the tray module according to an embodiment. FIG. 7 illustrates a schematic movement diagram (II) of the tray module according to an embodiment. Specifically, as shown in FIG. 6, by means of a transverse groove of the first horizontal section 101, a diagonal groove of the inclined section 102, and a transverse groove of the second horizontal section 103, the first horizontal section 101, the inclined section 102, and the second horizontal section 103 form a shape a bit like S. In some embodiments, the carrier body 30 carries an expansion element, and the expansion element shown in FIG. 6 is a circuit board 34. When the tray module 100 is in a received state, a connector 341 on a left side (from the view of FIG. 6) of the circuit board 34 is electrically connected to a connector 510 of an external system 500, so that the external system 500 can operate. The user pulls the handle to the right side when needing to lift up the tray module 100, and the carrier body 30 is moved from the left end of the first horizontal section 101 to the right end of the first horizontal section 101, so as to separate the two connector 510 and 341 and electrically disconnect the circuit board 34 from the external system 500. Then the user continuously pulls the handle to cause the carrier body 30 to climb to the upper right side along the inclined section 102, so as to avoid a first chassis structure 210 and a second chassis structure 220 respectively located on the left and right sides of the chassis 200. When the carrier body 30 is moved to the far right side of the inclined section 102, the user may move the carrier body 30 rightward along the second horizontal section 103, so as to pull out the carrier body 30 toward the outside of the chassis 200, thereby facilitating replacement and maintenance and repair of the circuit board on the carrier body 30. In some embodiments, the first chassis structure 210 and the second chassis structure 220 are, for example, structures generated due to the shape design of a rack or a platform installed on a chassis or the chassis itself.

Referring to FIG. 7, in an embodiment, each of the side plates 1A and 1B has a guiding portion 10, each guiding portion 10 includes a first horizontal section 101 and an inclined section 102, and the inclined section 102 is connected to the first horizontal section 101. A quantity of the side plates 1A and 1B is configured to be an even number, for example, two, four, or six. The inclined section 102 is inclined relative to the first horizontal section 101. In some embodiments, the first horizontal section 101 and the inclined section 102 may also be slightly L-shaped. Specifically, as shown in FIG. 7, the first horizontal section 101 is an approximately transverse groove, and the inclined section 102 is an approximately diagonal groove, so that the first horizontal section 101 and the inclined section 102 are lightly L-shaped. The user moves the movable end 311 between the first horizontal section 101 and the inclined section 102 to switch the tray module 100 between the received state and the lifted state.

Further referring to FIG. 4 and FIG. 5, in some embodiments, a first section 32A is from the pivotal end 321 to the pivotal connection portion 322 of each second connecting rod 32, and a second section 32B is from the pivotal connection portion 322 to the operating end 323. The second section 32B is inclined to the first section 32A. When the movable end 311 is located on the second horizontal section 103, a first included angle D1 is formed between the first section 32A and the first connecting rod 31. When the movable end 311 is located on the first horizontal section 101, a second included angle D2 is formed between the first section 32A and the first connecting rod 31, and the first included angle D1 is less than the second included angle D2. Specifically, the second section 32B is inclined to the first section 32A, so as to prevent the second section 32B of the second connecting rod 32 from hitting or touching the chassis 200 when the tray module 100 is in the received state. When the tray module 100 is in the received state, the movable end 311 is located on the first horizontal section 101, and the first included angle D1 is formed between the first section 32A and the first connecting rod 31. When the tray module 100 is in a lifted state, the movable end 311 is located on the second horizontal section 103, and the second included angle D2 is formed between the first section 32A and the first connecting rod 31. In other words, when the movable end 311 is moved from the first horizontal section 101 to the second horizontal section 103, the included angle between the first section 32A of the second connecting rod 32 and the first connecting rod 31 is increased.

Further referring to FIG. 2 and FIG. 3, in some embodiments, the tray module 100 further includes a handle 9, and the handle 9 is disposed on the operating end 323 of the two second connecting rod 32 and connected to the two second connecting rods 32. Specifically, the handle 9 is connected to the second connecting rods 32 on the two sides of the carrier body 30, and the second connecting rods 32 are lifted up by pulling the handle 9.

Figure 8:
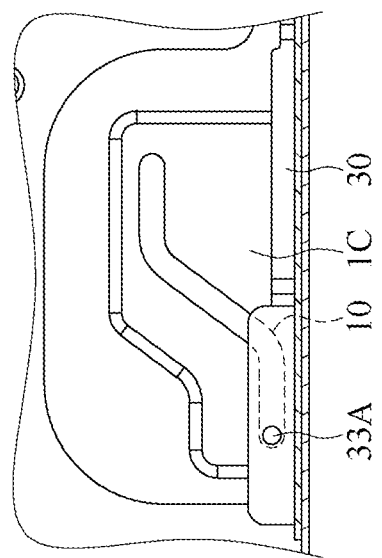
FIG. 8 illustrates a partial schematic diagram of a side plate of the tray module according to an embodiment.

Refer to FIG. 8 and refer to FIG. 2 and FIG. 3 again. FIG. 8 illustrates a partial schematic diagram of a side plate of the tray module according to an embodiment. In some embodiments, a quantity of the side plates is four, for example, and the movable end 311 of two first connecting rods 31 is pivotally connected to the carrier body 30, and is movably accommodated in each of the guiding portions 10 of two side plates 1A and 1B of the four side plates 1A, 1B, 1C, and 1D. Two protruding points 33A and 33B are disposed on two sides of the carrier body 30, and the carrier body 30 is movably accommodated in the guiding portions 10 of other two side plates 1C and 1D of the four side plates 1A, 1B, 1C, and 1D by means of the two bumps 33A and 33B. Each movable end 311 of each of the two first connecting rods 31 is pivotally connected to each side on a rear end (on a right side from the view of FIG. 2) of the carrier body 30, and is movably accommodated in the each guiding portion 10 of two side plates 1A and 1B. The two protruding points 33A and 33B are disposed on two sides on a front end (on a left side from the view of FIG. 2) of the carrier body 30. As shown in FIG. 8, the carrier body 30 is movably accommodated in the guiding portions 10 of the two side plates 1C and 1D by means of the two protruding points 33A and 33B. The two side plates 1C and 1D have the same structural configuration, and only the side plate 1C on one side is used as an example for description in FIG. 8. In another implementation, a quantity of the side plates is six. The side plates are respectively disposed at a front section, a middle section, and a rear section of the carrier body, so as to increase the stability of the carrier body.

Figure 9:
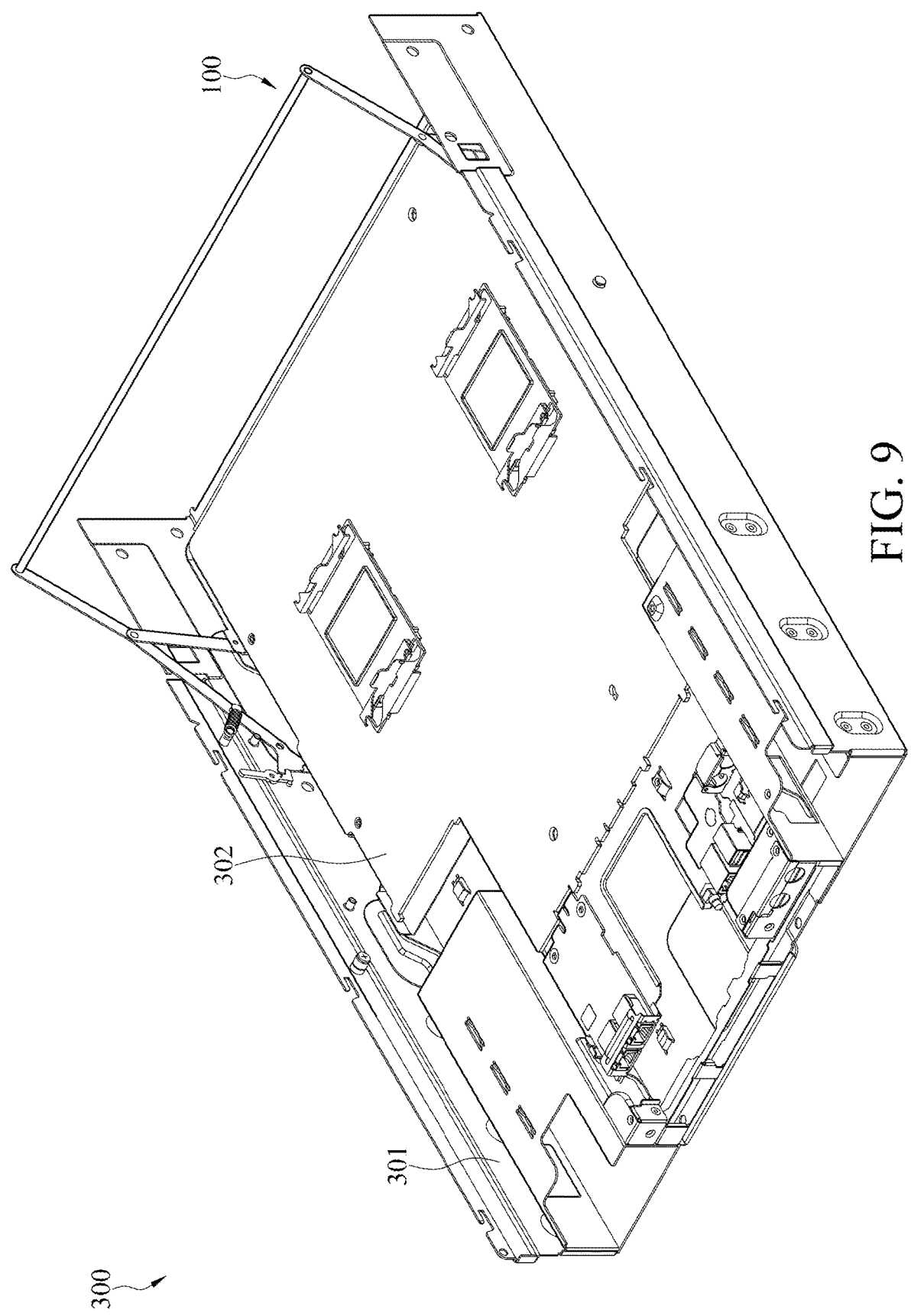
FIG. 9 illustrates a schematic three-dimensional view of a server according to an embodiment.

Referring to FIG. 9, FIG. 9 illustrates a schematic three-dimensional view of a server according to an embodiment. An embodiment of the present disclosure discloses a server 300, including a rack 301 and a tray module 100. In other words, the tray module 100 may be mated with the rack 301 to form the server 300, or the tray module 100 may be an independent element to mate with server cases of different specifications. According to some embodiments, the server 300 includes the rack 301, the tray module 100, and a function module 302. The function module 302 is fixed to the tray module 100. The rack 301 includes at least two side plates 1A and 1B. Each of the side plates 1A and 1B has a guiding portion 10, each guiding portion 10 includes a first horizontal section 101 and an inclined section 102, and the inclined section 102 is connected to the first horizontal section 101. The tray module 100 includes a carrier body 30, two first connecting rods 31, and two second connecting rods 32. Each first connecting rod 31 has a movable end 311 and a driven end 312, and the movable end 311 is pivotally connected to the carrier body 30 and slidably disposed in the each guiding portion 10. Each second connecting rod 32 has a pivotal end 321, a pivotal connection portion 322, and an operating end 323. Each pivotal connection portion 322 is located between the pivotal end 321 and the operating end 323, each pivotal end 321 is pivotally connected to each of the side plates 1A and 1B, and each driven end 312 is pivotally connected to the each pivotal connection portion 322. By operating the operating end 323 of the second connecting rod 32, the carrier body 30 is movable between the first horizontal section 101 and the inclined section 102, thereby saving labor and achieving easy assembling of the tray module 100 to the rack 301.

Based on the above, according to an embodiment, the tray module 100 and the server 300 are provided. The tray module 100 is applicable to the chassis 200. The chassis 200 includes at least two side plates 1A and 1B. The at least two side plates 1A and 1B each have a guiding portion 10. The tray module 100 includes a carrier body 30, two first connecting rods 31, and two second connecting rods 32. The movable end 311 of the first connecting rod 31 is pivotally connected to the carrier body 30 and slidably disposed in the each guiding portion 10. The pivotal end 321 of the second connecting rod 32 is pivotally connected to each of the side plates 1A and 1B, and the pivotal connection portion 322 of the second connecting rod 32 is pivotally connected to the driven end 312 of the first connecting rod 31. The carrier body 30 is movable between the first horizontal section 101 and the second horizontal section 103 by operating the operating end 323 of the second connecting rod 32, thereby saving labor and achieving easy assembling of the tray module 100 to the chassis 200.

What is claimed is:

1. A tray module, applicable to a chassis, wherein the chassis comprises at least two side plates, each side plate has a guiding portion, and the tray module comprises:
    a carrier body;
    two first connecting rods, wherein each of the two first connecting rods has a movable end and a driven end, and the movable end of the two first connecting rods is pivotally connected to the carrier body and slidably disposed in the guiding portion; and
    two second connecting rods, wherein each of the two second connecting rods has a pivotal end, a pivotal connection portion, and an operating end, the pivotal connection portion is located between the pivotal end and the operating end, each pivotal end is pivotally connected to the each side plate, and each driven end is pivotally connected to each pivotal connection portion;
    wherein the each guiding portion comprises a first horizontal section and an inclined section, the inclined section is connected to the first horizontal section.

2. The tray module according to claim 1, further comprising an elastic element, wherein the elastic element is disposed on the chassis, a hook portion is disposed on one of the two second connecting rods and located between the pivotal end and the operating end, and the elastic element is connected to the hook portion.

3. The tray module according to claim 2, further comprising a positioning assembly, wherein the positioning assembly comprises a toggle member and a torsion spring, the toggle member is disposed on the chassis and close to the pivotal end of one of the two second connecting rods, one end of the torsion spring abuts against the chassis, an other end of the torsion spring abuts against the toggle member, the toggle member comprises a toggle member body and a protrusion, the protrusion protrudes toward the pivotal end, a sliding portion is disposed on the pivotal end and comprises a recess, two stop portions, a first end, and a second end, the first end is opposite to the second end, the recess is close to the first end, the two stop portions are respectively disposed on the first end and the second end, and the protrusion of the toggle member is selectively accommodated in the recess or located on the second end.

4. The tray module according to claim 1, wherein the each guiding portion further comprises a second horizontal section connected to the inclined section, and the first horizontal section, the inclined section, and the second horizontal section of the each guiding portion form a shape a bit like S.

5. The tray module according to claim 1, wherein a first section extends from the pivotal end to the pivotal connection portion of the each second connecting rod, a second section extends from the pivotal connection portion to the operating end, the second section is inclined to the first section, when the movable end is located on the first horizontal section, a first included angle is formed between the first section and the first connecting rod, when the movable end is located on the inclined section, a second included angle is formed between the first section and the first connecting rod, and the first included angle is less than the second included angle.

6. The tray module according to claim 1, further comprising a handle, wherein the handle is disposed on the operating ends of the two second connecting rods and connected to the two second connecting rods.

7. The tray module according to claim 1, wherein the each first connecting rod has a bump, and each bump is disposed on the each movable end and is movably accommodated in the each guiding portion.

8. The tray module according to claim 1, wherein the at least two side plates comprises four side plates, the movable ends of the two first connecting rods are pivotally connected to the two sides of the carrier body respectively and are movably accommodated in the guiding portions of two of the four side plates, two protruding points are disposed on the two sides of the carrier body, and the carrier body is movably accommodated in the guiding portions of other two of the four side plates by means of the two protruding points.

9. A server, comprising:
    a rack, comprising at least two side plates that are correspondingly disposed on the rack, wherein each side plate has a guiding portion;
    a tray module, comprising:
        a carrier body;
        two first connecting rods, wherein each first connecting rod has a movable end and a driven end, and the movable end of the two first connecting rods is pivotally connected to the carrier body and slidably disposed in the guiding portion; and
        two second connecting rods, wherein each second connecting rod has a pivotal end, a pivotal connection portion, and an operating end, the pivotal connection portion is located between the pivotal end and the operating end, each pivotal end is pivotally connected to the each side plate, and each driven end is pivotally connected to each pivotal connection portion; and
        a function module, located on the carrier body.

10. The server according to claim 9, further comprising an elastic element, wherein the elastic element is disposed on the rack, a hook portion is disposed on one of the two second connecting rods and located between the pivotal end and the operating end, and the elastic element is connected to the hook portion.

11. The server according to claim 10, further comprising a positioning assembly, wherein the positioning assembly comprises a toggle member and a torsion spring, the toggle member is disposed on the rack and close to the pivotal end of one of the two second connecting rods, one end of the torsion spring abuts against the rack, another end of the torsion spring abuts against the toggle member, the toggle member comprises a toggle member body and a protrusion, the protrusion protrudes toward the pivotal end, a sliding portion is disposed on the pivotal end and comprises a recess, two stop portions, a first end, and a second end, the first end is opposite to the second end, the recess is close to the first end, the two stop portions are respectively disposed on the first end and the second end, and the protrusion of the toggle member is selectively accommodated in the recess or located on the second end.

12. The server according to claim 9, wherein the each guiding portion comprises a first horizontal section and an inclined section, the inclined section is connected to the first horizontal section.

13. The server according to claim 12, wherein the each guiding portion further comprises a second horizontal section connected to the inclined section, and the first horizontal section, the inclined section, and the second horizontal section of the each guiding portion form a shape a bit like S.

14. The server according to claim 12, wherein a first section extends from the pivotal end to the pivotal connection portion of the each second connecting rod, a second section extends from the pivotal connection portion to the operating end, the second section is inclined to the first section, when the movable end is located on the first horizontal section, a first included angle is formed between the first section and the first connecting rod, when the movable end is located on the inclined section, a second included angle is formed between the first section and the first connecting rod, and the first included angle is less than the second included angle.

15. The server according to claim 9, further comprising a handle, wherein the handle is disposed on the operating ends of the two second connecting rods and connected to the two second connecting rods.

16. The server according to claim 9, wherein the each first connecting rod has a bump, and each bump is disposed on the each movable end and is movably accommodated in the each guiding portion.

17. The server according to claim 9, wherein the at least two side plates comprises four side plates, the movable ends of the two first connecting rods are pivotally connected to the two sides of the carrier body respectively and are movably accommodated in the guiding portions of two of the four side plates, two protruding points are disposed on the two sides of the carrier body, and the carrier body is movably accommodated in the guiding portions of other two of the four side plates by means of the two protruding points.

* * * * *